United States Patent [19]

Sato et al.

[11] Patent Number: 4,542,712
[45] Date of Patent: Sep. 24, 1985

[54] APPARATUS FOR MOLECULAR BEAM EPITAXY

[75] Inventors: Kazuo Sato, Suginami; Sumio Yamaguchi, Nishitama; Shigeo Kato, Mitaka; Yasuhide Matsumura, Hachioji; Muneo Mizumoto, Tsuchiura; Sumio Okuno; Naoyuki Tamura, both of Kudamatsu, all of Japan

[73] Assignee: Hitachi, Ltd., Tokyo, Japan

[21] Appl. No.: 623,370

[22] Filed: Jun. 22, 1984

[30] Foreign Application Priority Data

Jun. 24, 1983 [JP] Japan ................................ 58-112721

[51] Int. Cl.[4] .............................................. C23C 13/12
[52] U.S. Cl. .................... 118/726; 118/500; 118/729; 156/DIG. 103; 156/614; 414/217
[58] Field of Search ............... 118/726, 729, 730, 719, 118/733, 500, 731; 156/DIG. 103, 614; 422/245, 247; 414/217, 221, 222, 225

[56] References Cited

U.S. PATENT DOCUMENTS

| 4,181,544 | 1/1980 | Cho | 156/614 X |
| 4,201,152 | 5/1980 | Cuscher | 118/500 X |
| 4,412,771 | 11/1983 | Gerlach et al. | 118/729 |
| 4,464,342 | 8/1984 | Tsang | 118/733 |

FOREIGN PATENT DOCUMENTS 2095704 10/1982 United Kingdom ............... 118/729

Primary Examiner—John D. Smith
Assistant Examiner—Bernard F. Plantz
Attorney, Agent, or Firm—Antonelli, Terry & Wands

[57] ABSTRACT

An apparatus for molecular beam epitaxy according to the present invention is so constructed that a substrate is introduced into a vacuum vessel with a substrate surface for epitaxial growth facing in the direction of gravity, and that the substrate is conveyed to and transferred into vacuum chambers for performing processes necessary for the epitaxial growth, with the substrate surface maintained in the direction of gravity and without directly touching the substrate surface.

2 Claims, 16 Drawing Figures

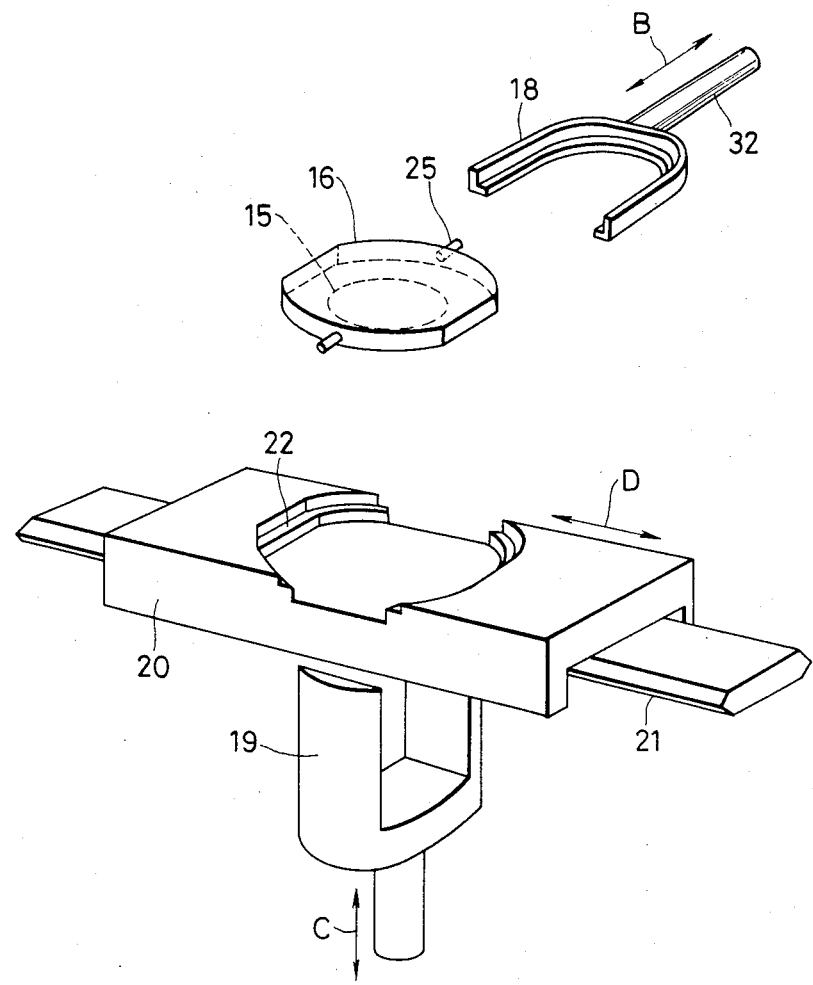

APPARATUS FOR MOLECULAR BEAM EPITAXY

BACKGROUND OF THE INVENTION

The present invention relates to an apparatus for molecular beam epitaxy, and more particularly to such apparatus well suited for automatically conveying a substrate in vacuum vessels while preventing the adhesion of flakes to the surface of the substrate.

The molecular beam epitaxy has come into the limelight in recent years as a technique for growing a thin film crystal on a substrate. In performing it on an industrial scale, however, important technical problems to be solved are left in an apparatus.

FIG. 1 is a plan view showing the construction of an apparatus which is required for performing the molecular beam epitaxy on the industrial scale (refer to 'Hyomen Kagaku (Surface Science)', Volume 3, No. 3 (1982), pp. 15-16). When broadly divided, the apparatus is composed of an introduction chamber 1, a preparation and analysis chamber 2, a growth chamber 3, and an outlet chamber 4, which are vacuum chambers, and a substrate conveying path 5 which is connected with these vacuum chambers through gate valves 7. The transfer of a substrate (not shown) between the conveying path 5 and each vacuum chamber is performed by a delivering manipulator 6 which has an arm penetrating the gate valve 7. The substrate is thrown from within the atmosphere into the introduction chamber 1. After the introduction chamber 1 has been evacuated down to an air pressure of $10^{-6}$–$10^{-8}$ Torr, the gate valve 7 is opened so as to transfer the substrate into the conveying path 5 (air pressure: $10^{-9}$–$10^{-10}$ Torr). The substrate is successively transferred into the preparation and analysis chamber 2 and the growth chamber 3 (both having an air pressure of $10^{-10}$–$10^{-11}$ Torr) through the conveying path 5, and is subjected to cleaning process of its surface and to the process of crystal growth in the respective chambers. Lastly, the substrate is conveyed out from the outlet chamber 4 (air pressure: $10^{-6}$–$10^{-8}$ Torr) into the atmosphere again.

One technical problem in the apparatus as stated above lies in a substrate conveying system under high vacuum and ultrahigh vacuum for conveying the substrate thrown from within the atmosphere into the apparatus, into the ultrahigh vacuum chambers, and for conveying the substrate subjected to the processes necessary for the epitaxial growth, one of the apparatus to the atmosphere again. The substrate must be conveyed without being damaged during the conveyance, and reliably without being dropped. Further, in order to reduce the lattice defects of an epitaxial layer, the adhesion of flakes to the substrate surface in the course of the conveyance must be avoided to the utmost.

Meanwhile, in such apparatus, a high polymer such as lubricating oil cannot be used within the vacuum vessel because the ultrahigh vacuum must be attained. Moreover, the whole vacuum tank is frequently heated to a temperature of 250°-300° C. for the purpose of reducing gases to be emitted from the surfaces of the components within the vessel. Under such severe conditions, a precise motion mechanism which is usually employed in the atmosphere cannot be used because it incurs the problems of the seizing between the components, rapid abrasion, etc. It is also difficult to install within the vessel a driving source such as motor and sensors such as limit switches.

For these reasons, a substrate conveying system to be stated below has heretofore been adopted (refer to P. E. Luscher, 'THIN SOLID FILM', 1981, pp. 2-12). FIG. 2 shows the principal parts of the conveying system. A substrate of low mechanical strength 8, for example, one of GaAs is stuck to or mechanically held by a susceptor 9 of high rigidity (fabricated of Mo by way of example), and the susceptor 9 is conveyed as a unit. Such susceptor 9 is transferred between the conveying path and the respective vacuum chambers while keeping the state in which the substrate plane of the susceptor stands upright.

Any of substrate holders in the introduction chamber, the preparation and analysis chamber, the growth chamber and the outlet chamber and a substrate holder to travel in the conveying path has a substrate holding ring 13 as shown in FIG. 2. The susceptor has pins 10 erected on its side surface, and is held by the substrate holding ring 13 by means of L-shaped grooves 14 in which the pins fit. The attachment and detachment of the susceptor to and from the substrate holder in each vacuum chamber, and those to and from the substrate holder in the conveying path are both performed by the substrate delivering manipulator 6. This manipulator is a mechanism by which a rod 31 located in the vacuum is rectilinearly moved and rotated from the atmosphere side. A grip portion 11 disposed on the front end of the rod has grooves 12 in which the substrate holding ring 13 and also the pins 10 of the susceptor fit. Owing to the rectilinear motion and rotary motion of the manipulator, the susceptor is delivered from each vacuum chamber to the conveying path and vice versa.

In the prior-art apparatus stated above, all the operations of attaching and detaching the susceptor are performed manually while scrupulous care is taken by visual inspection through the viewports of the vacuum vessels. Nevertheless, the susceptor is apt to fall down because of the upright attitude, and the probability of dropping the susceptor is high. In recent years, as the construction of the apparatus has progressed to have a large number of vacuum vessels, an increased number of places for transfer are included, and the probability of dropping the susceptor increases more. The dropped susceptor cannot be picked up unless the vacuum chamber is exposed to the atmospheric air, so that the substrate conveying system in the prior art has been greatly disadvantageous. Another disadvantage is that, even when the substrate surface stands upright, flakes adherent on the inner wall of the vacuum vessel cannot be perfectly prevented from dropping to adhere on the substrate surface.

SUMMARY OF THE INVENTION

The present invention has been made in view of such drawbacks, and has for its object to provide an apparatus for molecular beam epitaxy which avoids the adhesion of flakes etc. on the surface of a substrate being conveyed and which enhances the reliability of the conveyance of the substrate and facilitates the automation of the substrate conveyance.

In order to accomplish the object, according to the present invention, an apparatus for molecular beam epitaxy comprises means to introduce a substrate into said apparatus with a substrate surface for epitaxial growth facing in a gravitational direction, processing chamber means to perform processes necessary for the epitaxial growth of the substrate surface by a molecular beam in ultrahigh vacuum, means capable of conveying the introduced substrate into said processing chamber means in the state in which the substrate surface is maintained in the gravitational direction, and means capable of transferring the introduced substrate to the conveyance means and transferring it between said conveyance means and said processing chamber means in the state in which the substrate surface is maintained in the gravitational direction, a thin film crystal being grown on the substrate surface by the molecular beam epitaxy.

BRIEF DESCRIPTION OF THE DRAWINGS

FIG. 3A is a front sectional view of a cassette carrying substrates in the present invention, while

FIG. 5 is a view showing a mechanism which delivers the substrate from a delivering manipulator to the conveying path;

DETAILED DESCRIPTION OF THE PREFERRED EMBODIMENTS

Now, the contents of the present invention will be described in detail in conjunction with embodiments.

Figure 1:
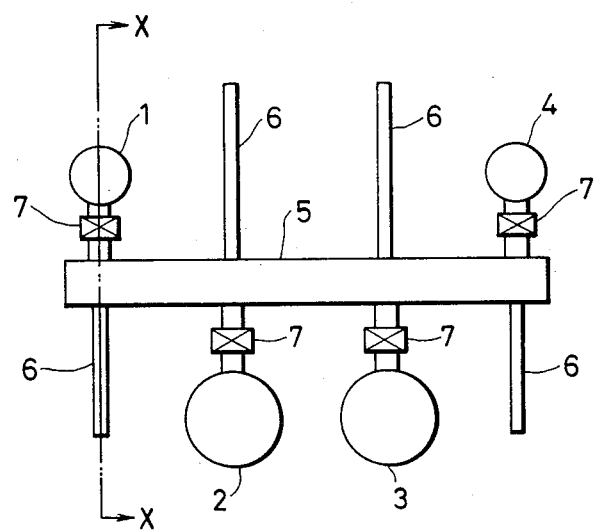
FIG. 1 is a plan view showing an example of construction of an apparatus for molecular beam epitaxy.
Figure 2:
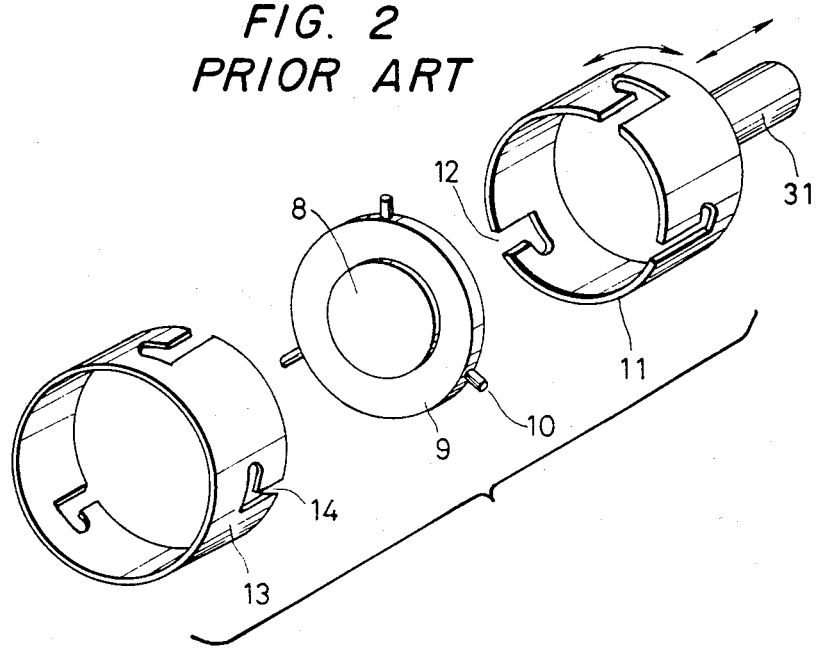
FIG. 2 is a sketch showing a substrate conveying system in a prior art.

In the molecular beam epitaxy apparatus of the construction shown in FIG. 1, as stated before, the substrate is attached to the susceptor, it is brought from the introduction chamber 1 into the vacuum vessel, and it is taken out of the outlet chamber 4 via the preparation and analysis chamber 2 as well as the growth chamber 3. The respective vacuum chambers are isolated from the conveyance chamber 5 by the gate valves 7.

Figure 3A:
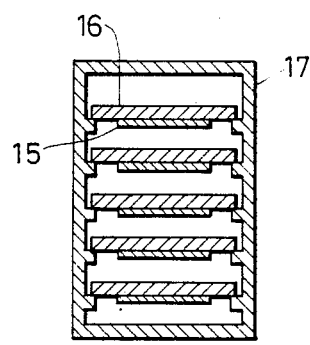
Figure 3B:
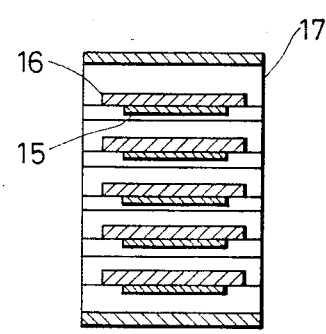
FIG. 3B is a side sectional view thereof.

In such construction, according to the present invention, the substrate is carried from within the atmosphere into the introduction chamber by a cassette 17 which is shown in FIGS. 3A and 3B. Substrates 15 are stuck or clamped to the surfaces of susceptors 16, and are thereafter placed on the shelves of the cassette 17 horizontally and downwards. The front of the cassette is open as shown in FIG. 3A, and the shelves extend on only the side surfaces as shown in FIG. 3B. With the cassette of the present embodiment, a large number of susceptors can be carried into the vacuum vessels at the same time. Therefore, continuous operations are possible without opening the vacuum vessels to the atmosphere during the epitaxial growth of one lot of substrates.

Figure 4A:
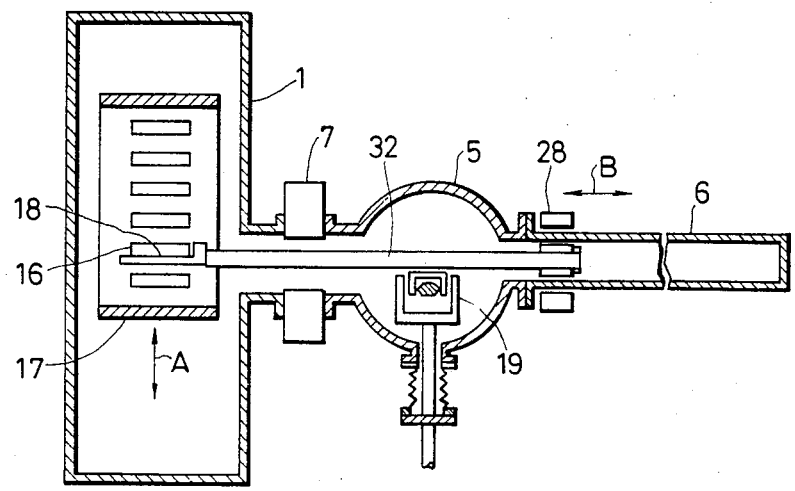
FIGS. 4A-4C are sectional views showing the steps of transfer of a susceptor from an introduction chamber to a conveying path, along a section X—X in FIG. 1.
Figure 4B:
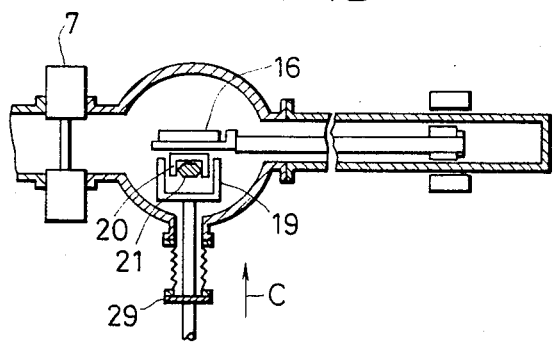
Figure 4C:
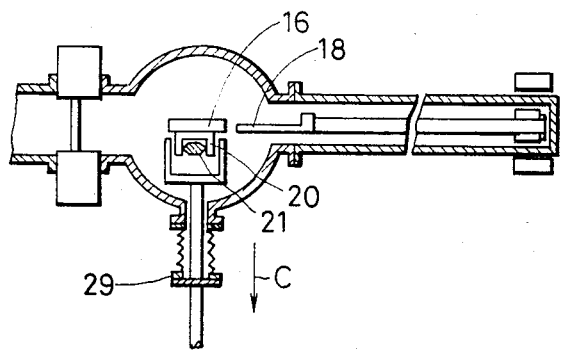

The steps of transfer of the susceptor from the introduction chamber 1 to the conveyance path 5 in FIG. 1 are shown in FIGS. 4A-4C as sectional views taken along X—X in FIG. 1. In case of transferring the susceptor 16 placed on any shelf of the cassette 17, the cassette 17 is fed in a vertical direction A and is stopped at a suitable height as shown in FIG. 4A. Subsequently, the gate valve 7 is opened, and the atmosphere side 28 of the magnetic coupling of the delivering manipulator 6 is advanced thereby to advance a magnetic coupling transfer rod 32 in the vacuum chamber, so that a transfer fork 18 attached to the front end of the rod enters the interspace between the shelves. Next, as shown in FIG. 4B, the transfer fork 18 is retreated and is stopped just above a transporter 20 waiting on the rail 21 of the conveyance path. Here, the gate valve 7 is closed. At the next step, a lift 19 is driven in a direction C from the atmosphere side by a linear motion feedthrough 29 which applies bellows, so that the susceptor 16 is raised. Under this state, the transfer fork 18 is further drawn back in a direction B, whereupon the lift 19 is lowered. Then, the susceptor has been placed on the transporter as shown in FIG. 4C.

Figure 6A:
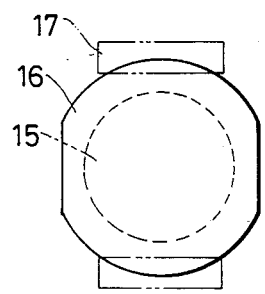
FIGS. 6A-6D are views showing the transition of the holding state of the susceptor.
Figure 6B:
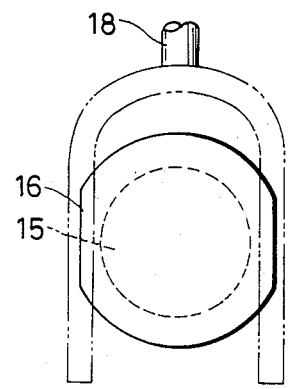
Figure 6C:
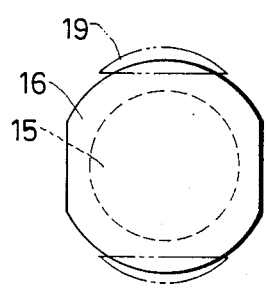
Figure 6D:
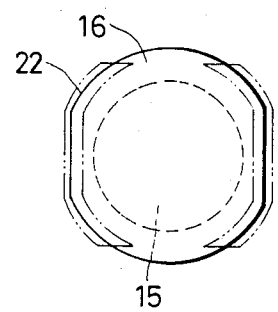

A schematic view of the mechanisms within the conveyance path in FIGS. 4A-4C is shown in FIG. 5. Important here is to hold the susceptor 16 so that all the mechanisms supporting the susceptor, such as the transfer fork 18, lift 19 and transporter 20, may not interfere with each other and may not touch the substrate stuck to the susceptor. FIGS. 6A-6D illustrate the transition of such holding states. The susceptor 16 placed on the shelf of the cassette 17 as shown in FIG. 6A is supported by the front end of the transfer fork 18 as shown in FIG. 6B, it is subsequently supported by the front end of the lift 19 as shown in FIG. 6C, and it is delivered to a shelf 22 on the transporter 20 as shown in FIG. 6D. In the respective figures, positions at which the susceptor is supported are indicated by two-dot chain lines.

As shown in FIG. 5, the transporter 20 is provided with the shelf (or seat) 22 so as to permit the susceptor 16 to be placed thereon with the substrate surface facing downwards. The transporter 20 carrying the susceptor 16 is moved on the rail 21 in a direction D while being drawn by a wire which is driven from the atmosphere side. As other methods of driving the transporter, the combination of a rack and a pinion, the traction employing a chain, the drive based on electromagnetic induction, etc. are possible.

While, in the above, the transfer of the susceptor from the introduction chamber to the conveying path has been explained, mechanisms which feed the substrate 15 from the transporter 20 stopped in front of the preparation and analysis chamber or the growth chamber inside the conveying path, into the ultrahigh vacuum chamber are quite similar to those shown in FIGS. 4B and 4C and FIG. 5.

Figure 7A:
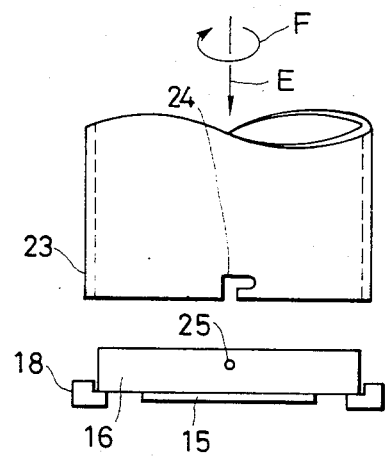
FIGS. 7A and 7B are front views showing states before and after the substrate is set on a substrate holder.
Figure 7B:
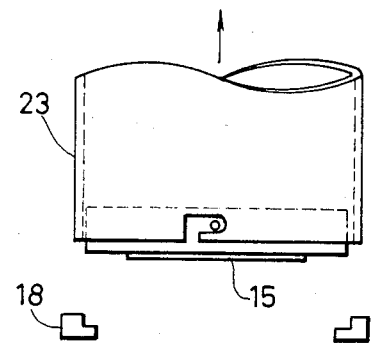
Figure 8A:
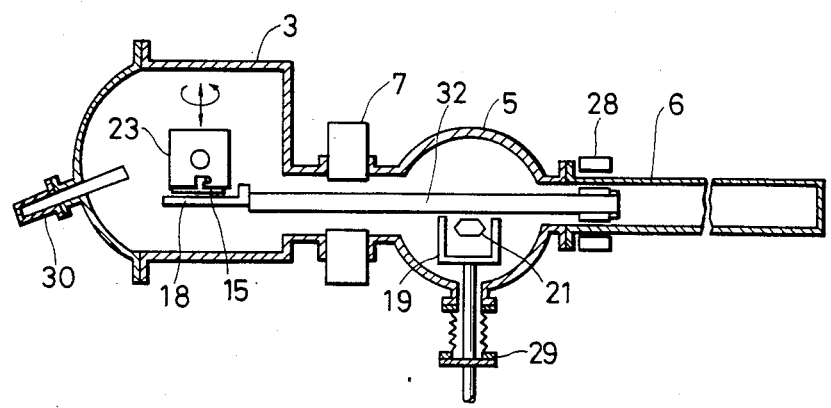
FIGS. 8A and 8B are views for explaining the motion of the sample in a growth chamber.
Figure 8B:
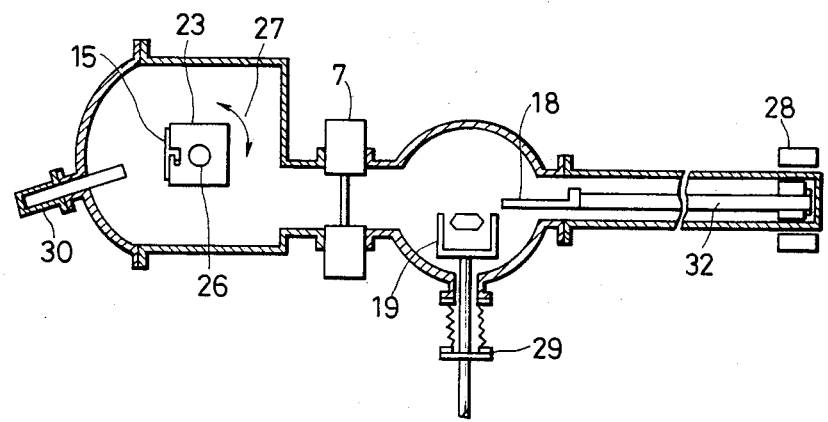

A mechanism for receiving the susceptor 16 in the preparation and analysis chamber or the growth chamber is as shown in FIGS. 7A and 7B. A substrate holder 23 performs a rectilinear motion E and a rotary motion F relative to the susceptor 16 placed on the transfer fork 18 of the delivering manipulator, to receive the susceptor by fitting a rod 25 on the susceptor side into an L-shaped groove 24 of the sample holder. In the irradiation of the substrate surface with a molecular beam or the analysis of the substrate surface, this substrate surface needs to be moved and rotated to an appropriate position within the vacuum chamber. In the present invention, by endowing the sample holder with the rotating and moving functions, the irradiation with the molecular beam and the analysis of the substrate surface have been permitted at the desired positions within the vacuum chambers irrespective of the sense of the substrate surface in the conveyance of the substrate. By way of example, the movements of the sample in a growth chamber employing a Knudsen molecular beam source are illustrated in FIGS. 8A and 8B. In the figures, numeral 30 indicates a Knudsen effusion cell (K- cell). After the substrate 15 is delivered to the substrate holder 23 while facing downwards as shown in FIG. 8A, it is moved to an irradiation position by a rotary motion in the direction of arrow 27 around an axis of a rod 26 so that the substrate is in a substantially vertical position as shown in FIG. 8B. The delivering manipulator 6 is withdrawn to the conveying path side, and the gate valve 7 is closed, whereupon the substrate surface is irradiated with the molecular beam.

In carrying out the substrate, the carrying-in procedure described above is traced conversely.

The substrate is kept facing downwards, namely, in the gravitational direction throughout the foregoing conveyance and transfer thereof, so that the possibility of the adhesion of flakes etc. to the substrate surface during the conveyance and transfer is very low. The present system is of great advantage particulary to the transfer of the substrate in the growth chamber where irradiated substances pile up on the components besides substrates and often fall down to the substrate surfaces. In addition, the motion of the delivering manipulator is rectilinear only, and the automation of the substrate conveyance is very easy.

Further, in the conveying system of the present invention, any of the vertical motion A of the cassette 17, the motion B of the delivering manipulator 6, the vertical motion C of the lift 19, and the movement D of the transporter 20 consists only of the rectilinear motion. A positioning signal for driving and stopping the rectilinear motion can readily be obtained by the combination of infrared or laser radiation which is introduced from within the atmosphere through the glass of the viewport of the vacuum vessel and a photoelectric sensor which receives the radiation. Moreover, even in the attachment and detachment of the susceptor to and from the substrate holder in the growth chamber or the preparation and analysis chamber which is the only place requiring the combination of the rotary motion and the linear motion, the motion of merely rotating the substrate holder while pressing it against the susceptor horizontally placed on the transfer fork has dispensed with the operation based on visual inspection.

As described above, the present invention brings forth the following effects:

(1) Since a substrate is conveyed and transferred with a substrate surface facing downwards, flakes etc. do not adhere to the substrate surface, and epitaxy of high quality with few lattice defects becomes possible.

(2) Since substrates can be piled up in a cassette in the form of shelves, it is permitted to carry a large number of substrates into a vacuum vessel at one time, and it is also permitted to continuously perform epitaxy while vacuum in the vessel is held.

(3) The substrate can be transferred without directly touching the substrate surface, and in transferring the substrate, it is held horizontal. Therefore, the failure rate of the transfer is much lower than in the prior-art system, and enhancement in the throughput is attained particularly in an apparatus of multi-chamber construction having many places for transfer.

(4) Whereas the motion of a manipulator for delivering the substrate has two degrees of freedom for rectilinear movement and rotation in the prior-art system, it becomes one degree of freedom for rectilinear movement only, so that the automation of the conveyance of the substrate is facilitated.

Even when the shape of the cassette for the introduction chamber in the present embodiment, the shape of the substrate holder in the preparation and analysis chamber as well as the growth chamber, or the aspect of the delivery of the substrate from the transporter to the transfer fork is changed into any other shape or aspect, the aforementioned effects are achieved with the design thought of the downward conveyance utilizing the force of gravity in the present invention. Needless to say, the apparatus is not restricted to the construction shown in FIG. 1, but the idea of the present invention is applicable even when the number of the vacuum chambers is larger or smaller than in the embodiment or when the conveyance path bends without existing in a single plane or the vacuum chambers are in a different arrangement.

What is claimed is:

1. An apparatus for molecular beam epitaxy comprising means to introduce a substrate into said apparatus with a substrate surface for epitaxial growth facing in a gravitational direction, processing chamber means to perform processes necessary for the epitaxial growth of the substrate surface by a molecular beam in ultrahigh vacuum, means capable of conveying the introduced substrate into said processing chamber means in the state in which the substrate surface is maintained in the gravitational direction, and means capable of transferring the introduced substrate to the conveyance means and transferring it between said conveyance means and said processing chamber means in the state in which the substrate surface is maintained in the gravitational direction, a thin film crystal being grown on the substrate surface by the molecular beam epitaxy, and means for rearranging the substrate surface of the substrate conveyed into said processing chamber means in a substantially vertical direction and setting the substrate surface toward an irradiation position of the molecular beam.

2. An apparatus for molecular beam epitaxy as defined in claim 1, wherein the introduction means is constructed so as to introduce a plurality of substrates from within the atmosphere into said apparatus collectively and simultaneously, and wherein said transferring means and said conveying means successively transfer and convey said substrates one by one from said introduction means into said processing chamber means.

* * * * *